United States Patent [19]
DeDontney et al.

[11] Patent Number: 5,683,516
[45] Date of Patent: Nov. 4, 1997

[54] SINGLE BODY INJECTOR AND METHOD FOR DELIVERING GASES TO A SURFACE

[75] Inventors: Jay B. DeDontney; Nicholas M. Gralenski; Adam Q. Miller, all of Santa Cruz, Calif.

[73] Assignee: Watkins-Johnson Co., Palo Alto, Calif.

[21] Appl. No.: 621,772

[22] Filed: Mar. 22, 1996

Related U.S. Application Data

[63] Continuation of Ser. No. 276,815, Jul. 18, 1994, abandoned.

[51] Int. Cl.⁶ .................................................. C23C 16/00
[52] U.S. Cl. ............................................ 118/718; 118/715
[58] Field of Search ..................................... 118/715, 718, 118/725; 156/345

[56] References Cited

U.S. PATENT DOCUMENTS

| | | | |
|---|---|---|---|
| 4,123,244 | 10/1978 | Leclereq | 65/60 C |
| 4,131,659 | 12/1978 | Authier | 264/25 |
| 4,136,828 | 1/1979 | Anderson | 239/422 |
| 4,293,326 | 10/1981 | Terneu | 65/60 D |
| 4,446,815 | 5/1984 | Kalbskopf | 118/718 |
| 4,499,853 | 2/1985 | Miller | 118/725 |
| 4,537,795 | 8/1985 | Nath | 427/39 |
| 4,834,020 | 5/1989 | Bartholomew | 118/719 |
| 4,986,216 | 1/1991 | Ohmori | 118/730 |
| 5,136,975 | 8/1992 | Bartholomew et al. | 118/715 |
| 5,221,556 | 6/1993 | Hawkins et al. | 427/255 |
| 5,232,508 | 8/1993 | Arena | 118/719 |
| 5,328,722 | 7/1994 | Ghanayem | 427/250 |
| 5,336,326 | 8/1994 | Karner | 118/723 HC |
| 5,391,232 | 2/1995 | Kanai | 118/715 |
| 5,411,590 | 5/1995 | Hawkins | 118/725 |
| 5,487,784 | 1/1996 | Ellis | 118/718 |

OTHER PUBLICATIONS

Webster's New Riverside University Dictionary, The Riverside Publishing Company, 1994 p. 859.

*Primary Examiner*—R. Bruce Breneman
*Assistant Examiner*—Jeffrie R. Lund
*Attorney, Agent, or Firm*—Flehr Hohbach Test Albritton & Herbert LLP

[57] ABSTRACT

A single body injector for delivering gases to a surface. The injector includes a single elongated block with one or more passages formed in the block and communicating with a gas delivery surface via thin channels which extend between the passages and the gas delivery surface. Metering tubes may be placed in the passages to control the profile of the gases delivered.

26 Claims, 5 Drawing Sheets

SINGLE BODY INJECTOR AND METHOD FOR DELIVERING GASES TO A SURFACE

This is a continuation of application Ser. No. 08/276,815 filed Jul. 18, 1994 now abandoned.

BRIEF DESCRIPTION OF THE INVENTION

The present invention relates to an injector for delivering gaseous chemicals to a surface. More particularly, the invention relates to an improved injector for delivering gaseous chemicals to a surface for depositing uniform films or layers on the surface by chemical vapor deposition (CVD).

BACKGROUND OF THE INVENTION

Chemical vapor deposition (CVD) is a critical component in semiconductor manufacturing. CVD occurs when a stable compound is formed by a thermal reaction or decomposition of certain gaseous chemicals and such compounds are deposited on a surface. CVD systems come in many forms. One apparatus for such a process comprises a conveyorized atmospheric pressure CVD (APCVD) system which is described in U.S. Pat. No. 4,834,020 and is owned by assignee. This patent is incorporated herein by reference.

One critical component of CVD systems is the injector utilized for delivering gaseous chemicals to the surface. The gases must be distributed over the substrate, so that the gases react and deposit an acceptable film at the surface of the substrate. A function of the injector is to distribute the gases to a desired location in a controlled manner. Controlled distribution of the gases maximizes the chance of complete, efficient and homogeneous reaction of the gases, in part by minimizing pre-mixing and prior reaction of the gases. A complete reaction provides a greater opportunity for a good quality film. If the gas flow is uncontrolled, the chemical reaction will not be optimal and the result will likely be a film which is not of uniform composition. When the film is not of uniform composition, the proper functioning of the semiconductor is impaired. Thus it is important that an injector design facilitates the desired flow of the gases in a controlled manner.

In a prior art injector, owned by the assignee and described in U.S. Pat. No. 5,136,975, a number of stacked plates each including a number of linear hole arrays is utilized. The plates produce a number of cascaded hole arrays and a chute surrounded by a cooling plate is positioned beneath the last hole array. The chute includes a central passage and ducts are formed between the chute and the cooling plate. Chemical lines deliver gases to a top plate which discretely conveys the gases to the top of individual cascaded hole arrays. The gases are fed through cascaded hole arrays which cause the gas to flow in an increasingly uniform manner. The chute passage receives the gases individually and then conveys the gases to a region above a wafer. In this region, the gases mix, react and then form a film or layer on the wafer.

The cascading action described above provides an uniformly distributed gas flow. However, flow control and simplicity of injector design can be improved.

OBJECTS AND SUMMARY OF THE INVENTION

It is an object of this invention to provide an improved apparatus for delivering gaseous chemicals to a surface.

More particularly, it is an object of this invention to provide an improved injector for delivering gaseous chemicals in a controlled manner to a surface for depositing films or layers on the surface by chemical vapor deposition (CVD).

Another object of this invention is to provide a simple injector fabricated from a single block of material, thereby eliminating complicated machined parts requiring precision alignment and positioning.

A further object of this invention is to provide an injector free from internal seals, thereby minimizing maintenance and associated costs.

A further object of this invention is to provide a method for manufacturing the injector of this invention.

A related object of this invention is to provide an injector which improves the uniformity of films deposited on wafers.

These and other objects are achieved by the injector herein disclosed comprising an elongated member with end surfaces and at least one gas delivery surface extending along the length of the member and which includes a number of elongated passages formed therein. Also formed within the member are a number of thin distribution channels which extend between the elongated passages and the gas delivery surface. In another embodiment of the invention a number of metering tubes may be inserted into each elongated passage and are spaced from the walls of said passages and extend between the ends. The metering tubes may contain openings of varying form and dimension which may be directed away from the distribution channels. The metering tubes receive a gaseous chemical which is conveyed along the metering tubes, whereby the gas flows out of the openings, and is conveyed through the corresponding distribution channel and is directed in a substantially controlled manner along the length of the gas delivery surface. In the instance where a number of gases are employed, the distribution channels direct the distribution of such gases to a region where mixing of the gases is desired. In addition the distribution channels prevent chemical fouling of the injector by preventing premature chemical reaction of the gases. The gases are directed to a desired region where they mix, react and form a uniform thin film on the substrate positioned beneath the injector.

BRIEF DESCRIPTION OF THE DRAWINGS

Other objects and advantages of the invention become apparent upon reading of the detailed description of the invention provided below and upon reference to the drawings, in which.

DETAILED DESCRIPTION OF THE INVENTION

Figure 1:
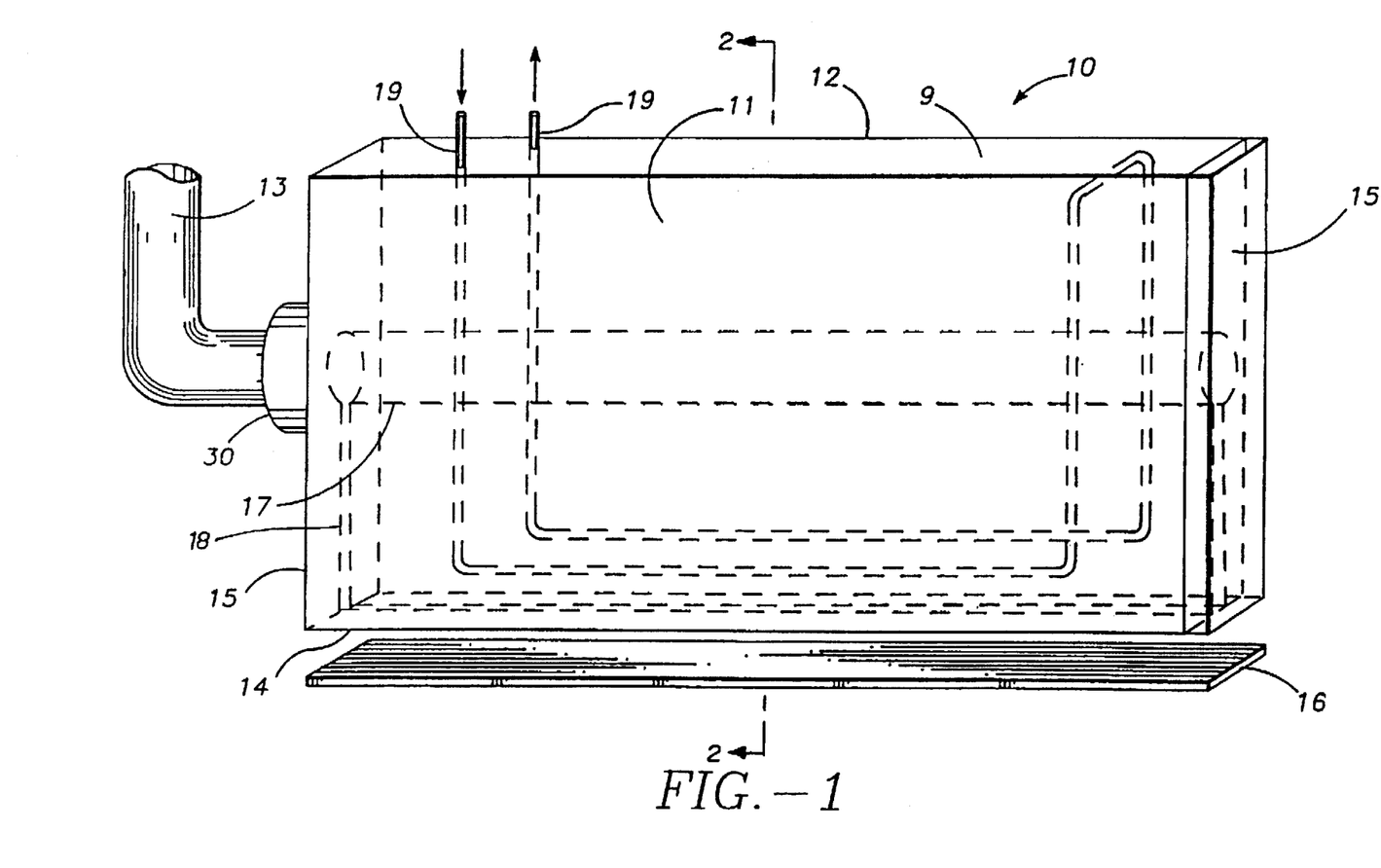
FIG. 1 is a side elevated view of an injector in accordance with one embodiment of the present invention.
Figure 2:
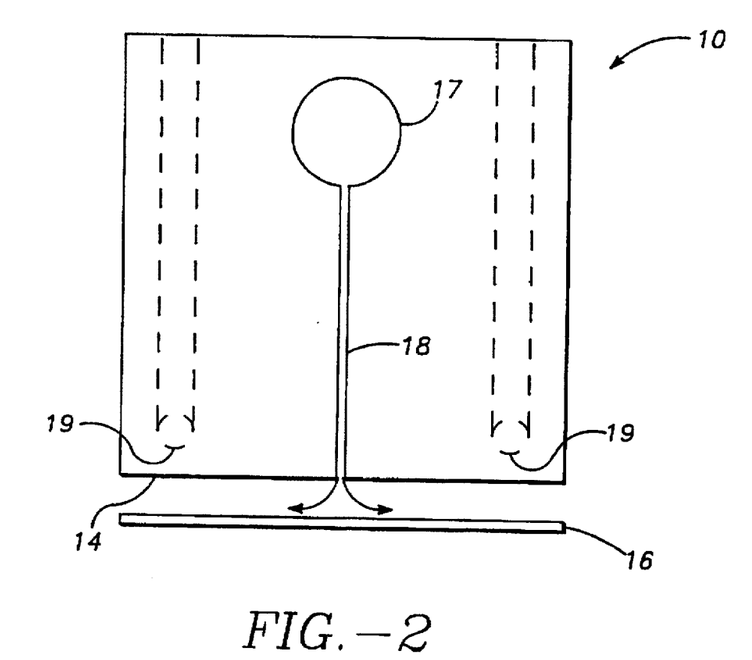
FIG. 2 is a cross-sectional view taken along the line 2—2 of FIG. 1. of one embodiment of the injector.

Turning to the drawings, wherein like components are designated by like reference numerals in the figures, FIGS. 1 and 2 represent one embodiment of the injector of the present invention. The injector 10 comprises a member or block which includes front 11, back 12, top 9, bottom 14 and end 15 surfaces. In this embodiment of the invention, the bottom surface 14 is the gas delivery surface. Positioned beneath injector 10 is a substrate 16.

The injector 10 includes a first elongated passage 17 formed in the injector 10 and extending between the end surfaces 15. One end surface 15 is closed. Chemical delivery line 13 leads to the end of the elongated passage 17. Additionally, formed in the injector 10 is a distribution channel 18 which extends between the elongated passage 17 and the gas delivery surface 14. A view along the length of the injector would show that the distribution channel 18 extends across the substrate 16. In this embodiment a second elongated passage 19 is formed within the injector 10, for circulation of a liquid or gas to control the temperature of the injector 10.

In a CVD process the gas which contains the elements to be deposited are introduced via chemical line 13 and flow along the passage 17 and from this passage 17 to the gas delivery surface 14 along the thin distribution channel 18. The gas flows out of the distribution channel 18 and exits the injector 10 along the length of the gas delivery surface 14, whereby the gas is delivered to a substrate as indicated generally by the arrows in FIG. 2. The gas is distributed by the injector in a substantially controlled linear manner. Although the member 10 has been described as a rectangular block, it can take any shape. The gas delivery surface 14 can be configured to enhance the distribution of the gas.

Figure 3:
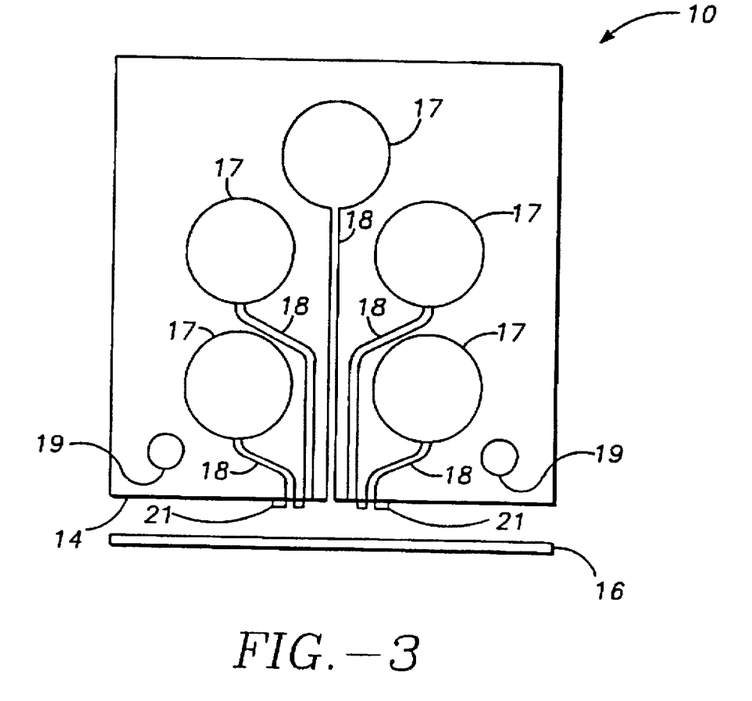
FIG. 3 is a cross-sectional view of an injector in accordance with a second embodiment of the invention.

In many applications a number of gases must be reacted to deposit a proper composition of a film or layer on an substrate. In such instances a plurality of passages is provided, as shown in FIG. 3, a second embodiment of the present invention. Injector 10 contains a plurality of first elongated passages 17, each extending between the end surfaces 15. A chemical delivery line 13 is attached to each passage 17. A plurality of distribution channels 18 are formed in the injector 10 and are spaced apart from one another. Each distribution channel 18 extends between a separate first elongated passage 17 and the gas delivery surface 14. Gases enter the passages 17 and are conveyed though the distribution channels 18 to the gas delivery surface 14, where such gases mix uniformly along the length and provide a film or layer upon the substrate 16. To enhance distribution of the gases, the distribution channels 18 direct the flow of the gases to a desired region adjacent to the substrate 16, as the gases exit along the gas delivery surface 14. Additionally, the distribution channels 18 prevent chemical fouling of the injector 10 by directing the gases away from the gas delivery surface thereby preventing premature reaction of the chemicals at such surface. Thus, the gases are individually distributed in a substantially linear flow manner to a desired region where the gases have an opportunity to mix, react and deposit a film or layer on substrate 16. Temperature control of the injector 10 may be accomplished by elongated passages 19.

A locator ridge 21, for locating the injector 10 in the CVD chamber, is provided which extends perpendicular from the gas delivery surface 14 and along the length of the surface 14, positioned outside the distribution channels 18. Although the locator ridge 21 has been described as extending from the gas delivery surface 14, it can be placed at other surfaces of the member 10.

Figure 4:
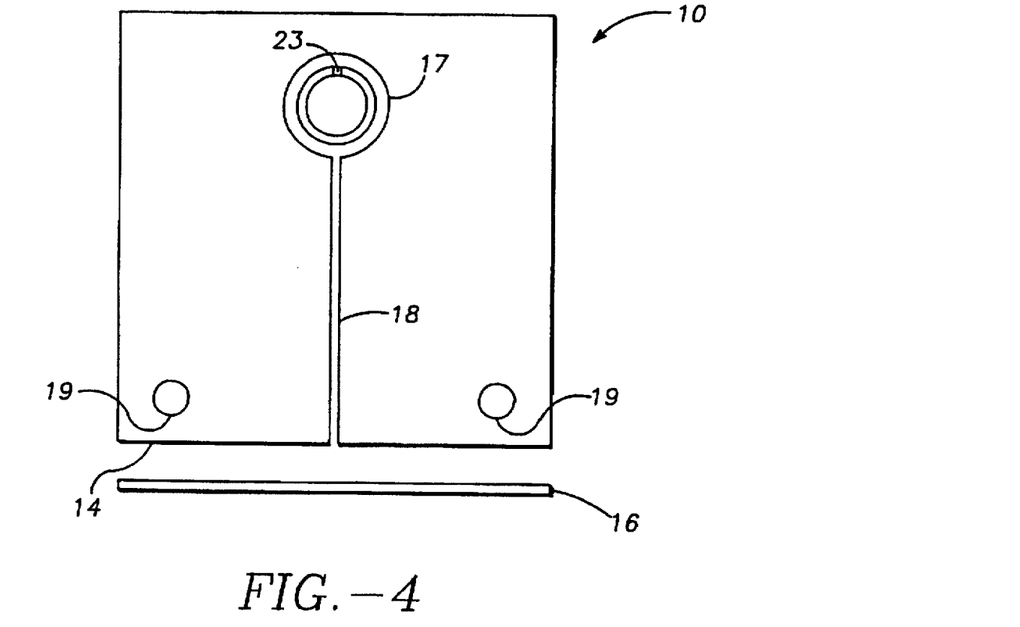
FIG. 4 is a cross-sectional view of an injector in accordance with a third embodiment of the invention.

In CVD applications it is desirable to maintain controlled flow and concentration of the gas introduced into the process. A metering tube 22 can be provided to maintain controlled flow and concentration. The metering tube 22 can also provide for control of the gas flow profile. In some instances it is desirable to provide a specified gas flow profile to compensate for variables in the CVD reaction area which can cause incomplete reaction of the gases and films which are not uniform in composition. For example, it may be desirable to direct a greater volume of gas to a particular area of the substrate 16. The third embodiment of the present invention illustrated in FIG. 4 provides a metering tube 22 containing an opening 23, inserted into the first elongated passage 17. The metering tube 22 is spaced from the walls of the passage 17, and extends between the end surfaces 15. A distribution channel 18 is formed within injector 10, and extends between the elongated passage 17 and the gas delivery surface 14. In one variation of this embodiment, the metering tube 22 includes openings 23, as depicted in FIG. 4. In another variation of this embodiment, the metering tube 22 is made from a porous material and openings are not included in the metering tube 22.

The metering tube 22 receives a gas from chemical line 13 and distributes the gas along the elongated passage 17, where the gas then flows through the distribution channel 18 to the gas delivery surface 14 and out to the substrate 16.

Figure 5:
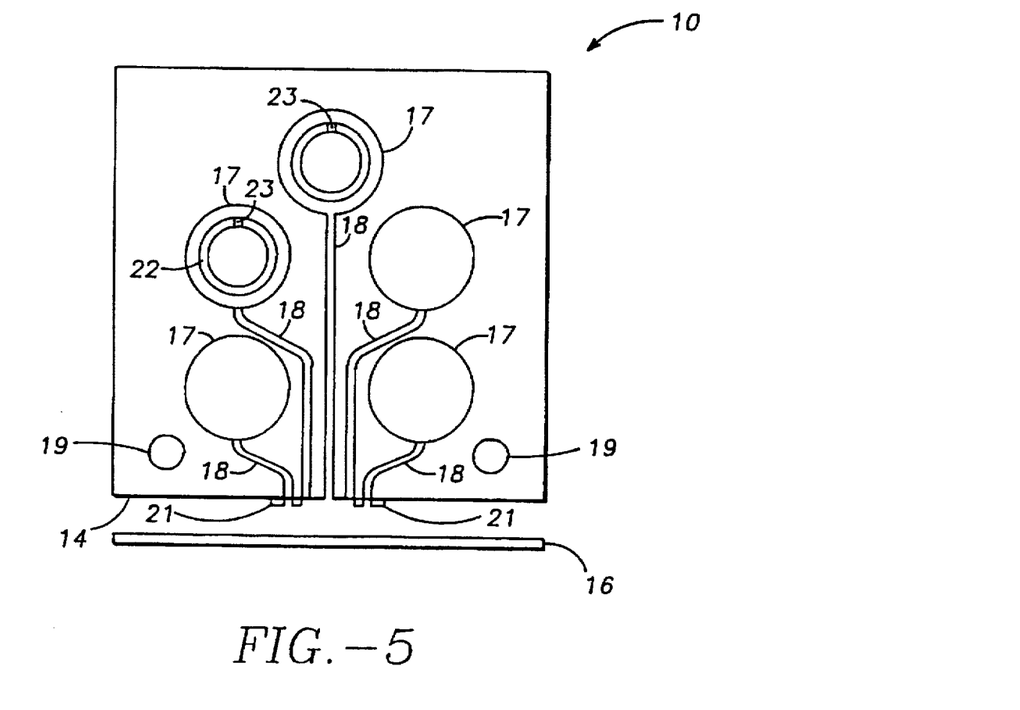
FIG. 5 is a cross-sectional view of an injector in accordance with a fourth embodiment of this invention.

FIG. 5 illustrates a forth embodiment of the present invention. A plurality of first elongated passages 17 are formed within injector 10, each extending between the end surfaces 15. A plurality of distribution channels 18 are formed in the injector 10 and the distribution channels 18 are spaced apart from one another. Each distribution channel 18 extends between a separate first elongated passage 17 and the gas delivery surface 14. At least one metering tube 22 containing an opening 23, is inserted into at least one of the first elongated passages 17. The metering tube 22 is spaced from the walls of the passage 17, and extends between the end surfaces 15. In a variation of this embodiment, a separate metering tube 22 may be inserted into each of the plurality of first elongated passages 17 provided. A chemical delivery line 13 is attached to each metering tube 22.

Referring again to FIG. 5, a locator ridge 21, for locating the injector 10 in the CVD chamber, is provided which extends perpendicular from the gas delivery surface 14 and along the length of the gas delivery surface 14, positioned outside the distribution channels 18. Temperature control may be accomplished by second elongated passages 19. Locator ridge 21 provides the mechanism for locating the injector 10 within the CVD chamber.

Thus, in the fourth embodiment, chemical delivery lines 13 are attached to corresponding metering tubes 21, or to a combination of metering tubes 21 and first elongated passages 17, and convey gaseous chemicals thereto. The gases pass through the metering tubes 22 and into the surrounding first elongated passages 17, and are conveyed through the corresponding distribution channels 18 to the gas delivery surface 14 along the length of the surface. The distribution channels 18 enhance distribution of the gases by individually directing the flow of the gases to a desired region adjacent to the substrate 16. The metering tubes 21 may be used to adjust the flow profile of one particular gas, or a number of gases to deliver gases of varying concentration at desired regions adjacent to the substrate, thereby controlling the chemical reaction rate occurring within the CVD chamber. By controlling the chemical reaction rate a more uniform film can be deposited on the substrate 16.

In order to adjust the gas flow pattern, many variations may be made in the metering tubes 22. Where a metering tube comprises openings 23, such openings may be directed away from the distribution channel 18. Alternatively, the openings 23 may be directed toward the distribution channel 18. In the preferred embodiment, the openings are opposite the distribution channel. The various configurations of metering tubes 22 are more fully appreciated with reference to FIGS. 6 through 10.

Figure 6:
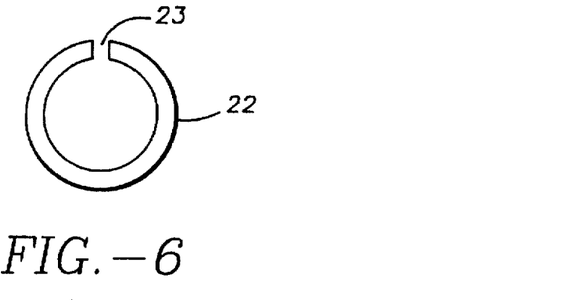
FIG. 6 is a cross-sectional view of the metering tube of the injector illustrated in FIGS. 4 and 5.

FIG. 6 depicts a cross-sectional view of metering tube 22 including an opening 23. Gas is conveyed through the metering tube and is outputted through opening 23. The configuration of opening 23 controls the gas outlet flow profile.

Figure 7:
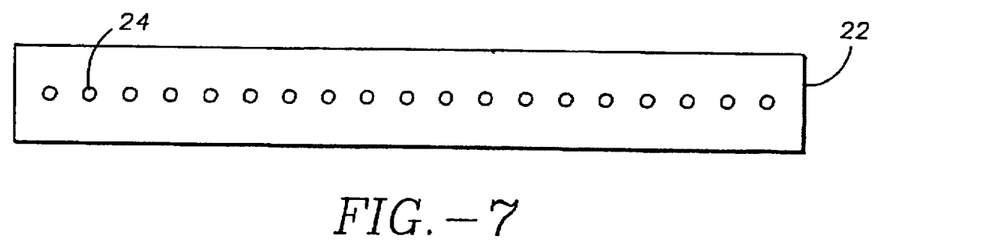
FIG. 7 illustrates a top plan view of one embodiment of an opening pattern in the metering tube of the injector shown in FIGS. 4, 5 and 6.

FIGS. 7 through 10 show the various opening configurations contemplated by the invention to provide adjustment to a desired gas flow pattern. Referring to FIG. 7, the openings 23 comprise a plurality of in-line holes 24 extending along the length of the metering tube 22. In this embodiment, the holes 24 are of equal diameter and equal spacing along the tube 22.

Figure 8:
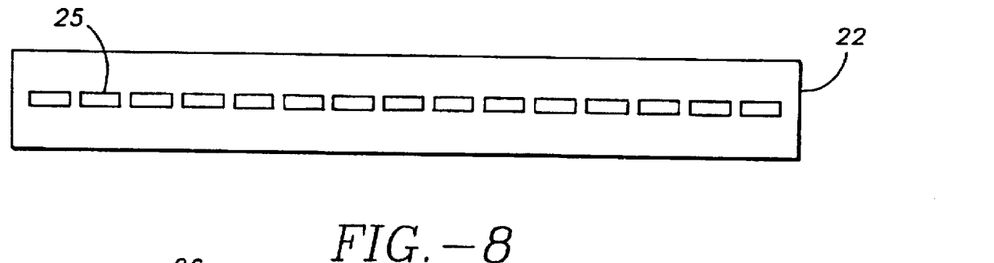
FIG. 8 is a top plan view of an alternative opening pattern in the metering tube of the injector shown in FIGS. 4, 5 and 6.

An alternative opening pattern is shown in FIG. 8, where the openings 23 comprise a plurality of in-line slots 25 extending along the length of the metering tube 22. The slots are of equal dimension and spacing along the tube 22.

Figure 9:
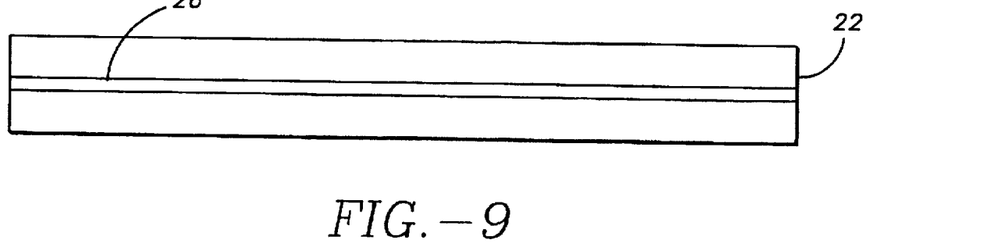
FIG. 9 illustrates a top plan view of a slotted opening in the metering tube of the injector shown in FIGS. 4, 5, and 6.

A further alternative opening pattern is depicted in FIG. 9, where a continuous slot 26 extends along the length of the metering tube 22.

Figure 10:
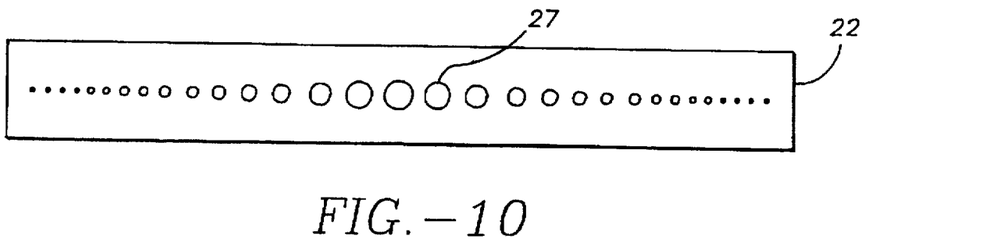
FIG. 10 is a top plan view of another alternative opening pattern in the metering tube of the injector shown in FIGS. 4, 5 and 6.

A still further alternative opening configuration is illustrated in FIG. 10. The openings 27 comprise a plurality of openings which vary in dimension, or spacing or a combination of both, along the length of the metering tube 22. The openings may be holes or slots. In one, the openings begin at a small dimension at each end of the metering tube 12, and gradually increase in dimension toward the center of the metering tube 22. The gas volume flow rate will be greater from the larger openings and thus the gas outlet flow pattern can be controlled.

Figure 11:
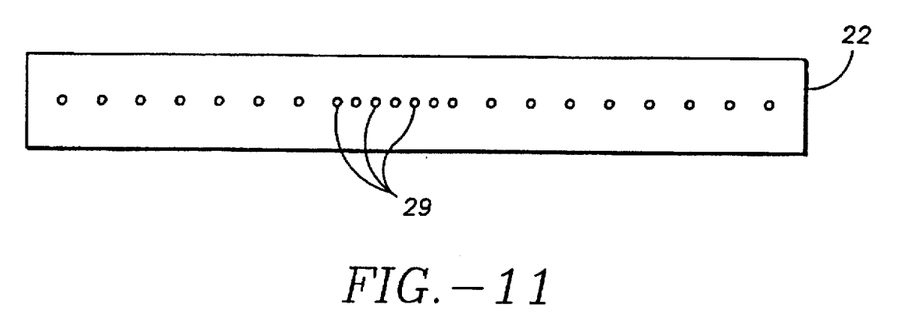
FIG. 11 is a top plan view of yet another alternative opening pattern in the metering tube of the injector shown in FIG. 4, 5 and 6.

A yet further alternative opening configuration is shown in FIG. 11. The openings 28 comprise a plurality of openings which are the same dimension and pitch along the length of the metering tube 22. Near the center of the metering tube 22, additional openings 29 are provided, such that the volume flow rate will be greater from the center of the metering tube 22.

Figure 12:
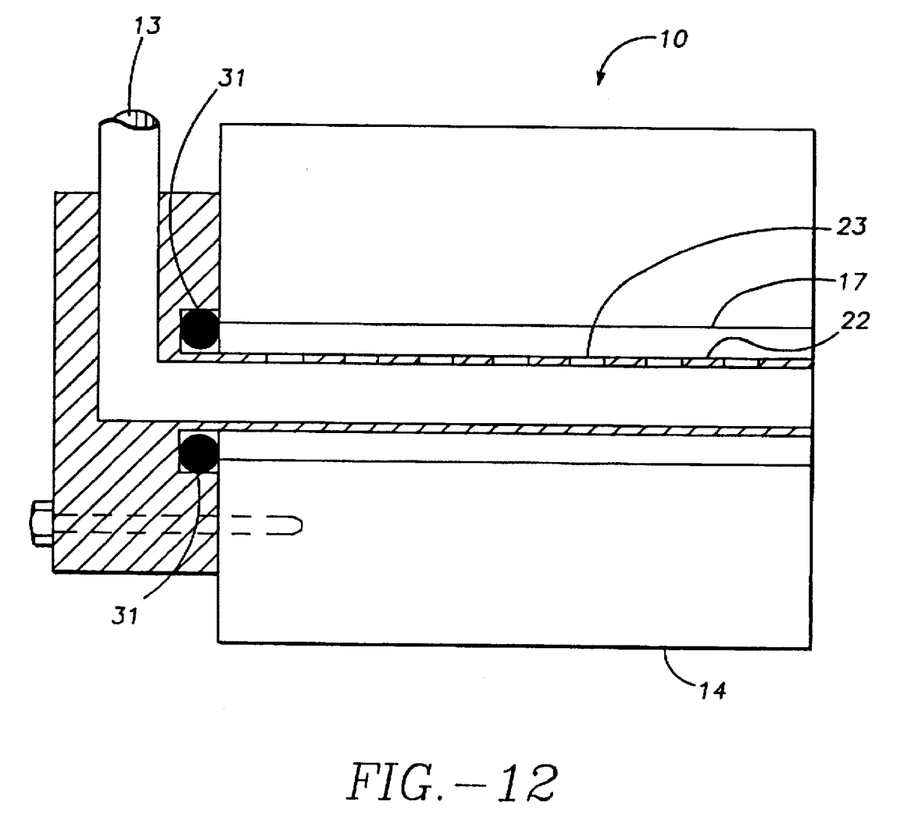
FIG. 12 illustrates an enlarged partial side view of the flange and metering tube attachment to the injector.

Finally, the attachment mechanism between the metering tube 22 and the chemical delivery lines 13 is more fully appreciated by reference to FIG. 12 which shows an enlarged partial side view of an attachment mechanism and metering tube of the injector. A metering tube 22 is inserted into a first elongated passage 17 and extends between the end surfaces 15. A flange 30 is attached to the chemical delivery line 13 and the flange is then attached to the end 15 of the injector 10. A seal 31 is provided therebetween. The metering tube 22 is attached to the flange and provides for an airtight seal.

Many variations of chemicals are used in CVD processes. The invention provides for various chemical delivery lines. In one embodiment the chemical delivery lines 13 may convey a combination of tetraethoxysilane (TEOS) and nitrogen in one line, nitrogen in a second line and ozone mixed with oxygen in a third line to form a layer of silicon dioxide.

As the foregoing illustrates, there are many variations possible for practicing the invention. The preferred embodiment comprises five first elongated passages, with five metering tubes inserted therein. The dimensions may vary, however in this preferred embodiment each passage is approximately ⅜ inches in diameter, and the outer diameter of each metering tube is approximately ¼ inch diameter. The metering tube contains fifty equally spaced holes of equal dimension along the length of the metering tube.

Various manufacturing techniques known in the art can be used to form the distribution channels 18. In the preferred embodiment the distribution channels are formed by a wire electrode discharge machine (EDM).

A particular advantage made apparent by the above description, is the simplicity of design of the injector. The invention eliminates the need for seals within the injector body. The present invention eliminates the requirement for welding and bolting of various internal body components. The present invention eliminates the requirement for precision alignment and positioning of internal body components necessary for proper gas flow in many injectors. The elimination of such components should minimize maintenance requirements, thereby reducing costly down time. In particular, the injector of the present invention will not have to be disassembled and rebuilt to replace failed internal seals. In addition, gaseous chemical leakage should be reduced.

Another improvement of the present invention is apparent by referring to the metering tubes. The metering tubes are replaceable, thus one can vary the configuration of gas flow desired by simply detaching one metering tube and inserting another metering tube of differing aperture placement or diameter. No disassembly of the injector body is required. Further, modeling or experimentation allow customized metering tubes to be manufactured for particular applications or machines.

The simplicity of the design favors formation of precise components and thus, greater control of gas distribution.

Thus, the foregoing demonstrates an improved injector for delivering gaseous chemicals to a surface which fully satisfies the aims, advantages and objects set forth above.

While the invention has been described in connection with specific embodiments, it is evident that may variations, substitutions, alternatives and modifications will be apparent to those skilled in the art in light of the foregoing description. Accordingly, this description is intended to encompass all such variations, substitutions, alternatives and modifications as fall within the spirit of the appended claims.

What is claimed:

1. An injector for providing uniform gas distribution to a substrate, comprising:

a single elongated member having end surfaces and one planar elongated external gas delivery surface extending along the length of the member directly facing and parallel to the substrate;

at least a first elongated cylindrical passage formed in said elongated member and extending between the end surfaces serving to receive a gas;

a thin, elongated distribution slot of substantially constant width formed in said single elongated member and extending directly between said first elongated cylindrical passage and said gas delivery surface for carrying gas directly and uniformly from said elongated passage for distribution uniformly in a continuous, unobstructed manner along the elongated external gas delivery surface.

2. The apparatus of claim 1, further comprising at least one second elongated passage formed in said elongated member and extending between the ends serving to receive a medium for temperature control of the injector.

3. The apparatus of claim 1 wherein the thin distribution channel is formed by EDM machining.

4. An injector for providing gas distribution to a substrate, comprising:

a single elongated member having end surfaces and at least one planar elongated external gas delivery surface extending along the length of the member directly facing and parallel to the substrate;

a plurality of first elongated cylindrical passages formed in said elongated member and extending directly between the end surfaces, each serving to receive a gas;

a plurality of thin, spaced, elongated distribution slots each of substantially constant width formed in said single elongated member, one of said plurality of slots extending directly between each of said first elongated cylindrical passages and the gas delivery surface for carrying the gases directly and uniformly from the respective passage to the gas delivery surface for uniform distribution in a continuous, unobstructed manner along the substrate placed adjacent said delivery surface.

5. The apparatus of claim 4, further comprising at least one ridge extending from the gas delivery surface positioned outside of said distribution slots and extending along the length of said surface for positioning the injector.

6. The apparatus of claim 4, further comprising at least one second elongated passage formed in said elongated member and extending between the ends serving to receive a medium for temperature control of the injector.

7. The apparatus of claim 4 wherein the plurality of thin distribution channels are formed by EDM machining.

8. An injector for providing uniform gas distribution to a substrate comprising:

a single elongated member having end surfaces and at least one planar external gas delivery surface extending along the length of the member directly facing and parallel to the substrate;

at least a first elongated cylindrical passage formed in said elongated member and extending between the end surfaces;

at least a first thin, uniform elongated distribution slot of substantially constant width formed in said elongated member and extending directly between said first elongated cylindrical passage and said gas delivery surface for carrying gas directly and uniformly from said elongated passage for distribution uniformly in a continuous, unobstructed manner along the gas delivery surface; and a metering tube inserted into said first elongated cylindrical passage and spaced from the walls of said first elongated passage and extending between the ends, serving to receive a gas and distribute the gas along the elongated passage where it flows through the distribution slot to the substrate.

9. The apparatus of claim 8, further comprising at least one second elongated passage formed in said elongated member and extending between the ends serving to receive a medium for temperature control of the injector.

10. The apparatus of claim 8 wherein the metering tube comprises a porous material.

11. The apparatus of claim 8 wherein the metering tube comprises a slot extending along the length of said metering tube.

12. The apparatus of claim 11 whereto and said slot is directed away from the distribution channel.

13. The apparatus of claim 8 wherein the metering tube comprises a plurality of openings along the length of said metering tube, said openings being directed away from the distribution slot.

14. The apparatus of claim 13 wherein said plurality of openings vary in dimension along the length of said metering tube.

15. The apparatus of claim 13 wherein said plurality of openings vary in spacing along the length of said metering tube.

16. The apparatus of claim 8 wherein the thin distribution channel is formed by EDM machining.

17. An injector for providing uniform gas distribution to a substrate, comprising:

a single elongated member having end surfaces and one planar elongated external gas delivery surface extending along the length of the member directly facing and parallel to the substrate;

a plurality of elongated cylindrical passages formed in said elongated member and extending between the end surfaces;

a plurality of thin, spaced, elongated distribution slots each of substantially constant width, one for each of said elongated passages, formed in said elongated member and extending directly between each of said elongated cylindrical passages and the gas delivery surface, said distribution slots spaced from one another, for carrying the gases from said elongated cylindrical passages to said gas delivery surface for uniform distribution in a continuous, unobstructed manner along the length of the substrate; and a plurality of metering tubes, one for each of said elongated cylindrical passages, one inserted into each of said elongated cylindrical passages and spaced from the walls of each of said first elongated cylindrical passages and extending between the ends serving to receive a gas and distribute the gas along the associated elongated passage where it flows uniformly through the distribution slot to the substrate.

18. The apparatus of claim 17, further comprising at least one ridge extending from the gas delivery surface positioned outside said distribution slots and extending along the length of said surface for positioning the injector.

19. The apparatus of claim 17, further comprising at least one second elongated passage formed in said elongated member and extending between the ends serving to receive a medium for temperature control of the injector.

20. The apparatus of claim 17 wherein at least one of said plurality of metering tubes comprises a porous material.

21. The apparatus of claim 17 wherein at least one of said plurality of metering tubes comprises a slot extending along the length of said metering tube, said slot being directed away from the distribution slot.

22. The apparatus of claim 17 wherein at least one of said plurality of metering tubes comprises a plurality of openings along the length of said metering tube, and said openings being directed away from the distribution slot.

23. The apparatus of claim 22 wherein said plurality of openings vary in dimension along the length of said metering tube.

24. The apparatus of claim 22 wherein said plurality of openings vary in spacing along the length of said metering tube.

25. The apparatus of claim 17 further comprising a flange attached to said metering tube, and said flange is attached to one of said end surfaces of the elongated member.

26. The apparatus of claim 17 wherein the plurality of thin distribution channels are formed by EDM machining.

* * * * *